United States Patent
Hendrickson

(10) Patent No.: US 7,123,678 B2
(45) Date of Patent: Oct. 17, 2006

(54) RZ RECOVERY

(75) Inventor: Norm Hendrickson, Colorado Springs, CO (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 732 days.

(21) Appl. No.: 10/066,982

(22) Filed: Feb. 1, 2002

(65) Prior Publication Data

US 2002/0110215 A1    Aug. 15, 2002

Related U.S. Application Data

(60) Provisional application No. 60/266,395, filed on Feb. 1, 2001.

(51) Int. Cl.
    *H03D 3/24*    (2006.01)

(52) U.S. Cl. ...................................... 375/376; 375/354

(58) Field of Classification Search ................ 375/286, 375/359, 375, 376, 373, 242, 106, 120, 282, 375/333, 360, 361, 368, 371, 328, 374, 293; 341/68, 69, 70; 327/147, 157, 175, 156, 327/167, 165, 356, 7, 5, 263, 154, 141; 331/25, 331/17, 57, DIG. 3, 173, 187; 359/154, 359/158, 326

See application file for complete search history.

(56) References Cited

U.S. PATENT DOCUMENTS

| | | | | |
|---|---|---|---|---|
| 3,835,398 A | * | 9/1974 | Russer | 327/167 |
| 4,464,769 A | * | 8/1984 | Forsberg et al. | 375/368 |
| 4,527,277 A | * | 7/1985 | Kosaka et al. | 375/328 |
| 4,546,486 A | * | 10/1985 | Evans | 375/374 |
| 4,696,016 A | * | 9/1987 | Rozema et al. | 375/293 |
| 4,918,405 A | | 4/1990 | Herleikson | |
| 4,926,447 A | | 5/1990 | Corsetto et al. | |
| 4,970,609 A | | 11/1990 | Cunningham et al. | |
| 5,056,118 A | * | 10/1991 | Sun | 375/342 |
| 5,172,397 A | * | 12/1992 | Llewellyn | 375/359 |
| 5,295,164 A | | 3/1994 | Yamamura | |
| 5,329,559 A | | 7/1994 | Wong et al. | |
| 5,455,847 A | | 10/1995 | Guilford et al. | |
| 5,592,519 A | | 1/1997 | Honaker, Jr. | |
| 5,610,954 A | | 3/1997 | Miyashita et al. | |
| 5,663,666 A | | 9/1997 | Chu et al. | |
| 5,689,530 A | * | 11/1997 | Honaker, Jr. | 375/286 |
| 5,822,386 A | | 10/1998 | Pawelski | |
| 5,889,828 A | * | 3/1999 | Miyashita et al. | 375/374 |
| 5,905,759 A | * | 5/1999 | Ishida et al. | 375/282 |
| 5,936,445 A | | 8/1999 | Babanezhad et al. | |
| 5,952,853 A | | 9/1999 | Willingham et al. | |

(Continued)

FOREIGN PATENT DOCUMENTS

EP    0 665 651 A2    8/1995

(Continued)

OTHER PUBLICATIONS

International Search Report, International Application No. PCT/US02/03432, mailed Apr. 19, 2002, 3 pages.

(Continued)

*Primary Examiner*—Temesghen Ghebretinsae
(74) *Attorney, Agent, or Firm*—Christie, Parker & Hale, LLP

(57) ABSTRACT

A data and clock recovery system adapted for use with RZ data. In one embodiment a phase detector provides phase information for low to high data signal transitions only. In another embodiment a clock recovered from rising transitions is mixed with a clock recovered from falling transitions to form a recovered clock signal.

4 Claims, 4 Drawing Sheets

U.S. PATENT DOCUMENTS

| | | |
|---|---|---|
| 5,953,386 A | 9/1999 | Anderson |
| 5,963,069 A | 10/1999 | Jefferson et al. |
| 5,966,033 A | 10/1999 | Miller |
| 5,987,085 A | 11/1999 | Anderson |
| 6,008,746 A * | 12/1999 | White ............... 341/70 |
| 6,028,903 A | 2/2000 | Drost et al. |
| 6,041,090 A | 3/2000 | Chen |
| 6,104,326 A | 8/2000 | Lee et al. |
| 6,124,996 A | 9/2000 | Fasen et al. |
| 6,198,559 B1 | 3/2001 | Gehlot |
| 6,266,799 B1 | 7/2001 | Lee et al. |
| 6,307,906 B1 | 10/2001 | Tanji et al. |
| 6,310,498 B1 | 10/2001 | Larsson |
| 6,310,521 B1 | 10/2001 | Dalmia |
| 6,316,966 B1 | 11/2001 | Chang et al. |
| 6,317,008 B1 | 11/2001 | Gabara |
| 6,324,236 B1 * | 11/2001 | Bladh ............... 375/375 |
| 6,327,318 B1 | 12/2001 | Bhullar et al. |
| 6,404,819 B1 * | 6/2002 | Gehlot ............... 375/242 |
| 6,469,823 B1 * | 10/2002 | Kikuchi et al. ......... 359/326 |
| 6,496,552 B1 * | 12/2002 | Tomofuji et al. ....... 375/373 |
| 2002/0048069 A1 * | 4/2002 | Ibukuro ............... 359/154 |

FOREIGN PATENT DOCUMENTS

| | | |
|---|---|---|
| EP | 0 665 651 A3 | 8/1995 |
| EP | 0 901 126 A1 | 3/1999 |
| WO | WO 98/44673 | 10/1998 |
| WO | WO 99/67882 | 12/1999 |

OTHER PUBLICATIONS

Savoj, Jafar, et al., "A CMOS Interface Circuit for Detection of 1.2Gb/s RZ Data", ISSCC99, Feb. 16, 1999 (2 pgs).

Dally, William J., et al., "Digital Systems Engineering", Cambridge University Press, 1998 (pp. 633-641).

* cited by examiner

RZ RECOVERY

CROSS REFERENCE TO RELATED APPLICATIONS

This application claims benefit of U.S. Provisional Application No. 60/266,395 filed on Feb. 1, 2001 which is hereby incorporated by reference as if set forth in full herein.

BACKGROUND OF THE INVENTION

The present invention relates generally to clock recovery circuits and methods and in particular to systems and methods performing clock recovery for return-to-zero (RZ) serial data stream.

Modern communication systems transfer tremendous amounts of data at ever increasing rates. Various transmission schemes and encoding of data are utilized to assist in the transfer. One particular type of encoding scheme for digital data transmission is a return-to-zero (RZ) data stream. A RZ data stream transmits digital data in which a logical one and a logical zero are determined based on voltage pulses having certain or specific characteristics. In particular, a logical one or zero is determined by the voltage during a first half of each bit. The signal returns to a resting state, typically zero volts, during the subsequent or remaining half of the bit. Additionally, there are two types of RZ data, a positive logic RZ data and negative logic RZ data.

In positive-logic RZ data, a logical zero is represented by a voltage that is more negative or less positive then the voltage that represents a logical one. Conversely, in negative-logic RZ data, a logical zero is represented by a voltage that is more positive or less negative then the voltage that represents a logical one.

Another type of encoding scheme for digital data transmission is a non-return-to-zero (NRZ) data in which a logical one and zero are determined by specific and constant direct-current (DC) voltages. Similar to RZ data, NRZ data has two forms, a positive-logic NRZ data and a negative-logic NRZ data. In positive-logic NRZ data, a logical zero is represented by a voltage that is more negative or less positive then the voltage that represents a logical one. Likewise, in negative-logic NRZ data, the logical zero is represented by a voltage that is more positive or less negative then the voltage that represents a logical one.

Typically, the data stream transmitted in either form, as RZ or NRZ data, is transferred optically and then converted to electrical signals. Subsequently, clock and data information are retrieved from the converted electrical signals. However, optimizing the retrieval of clock and data information from the converted electrical signals is sometimes difficult.

SUMMARY OF THE INVENTION

The present invention provides a return-to-zero recovery system that optimizes data re-timing and improves signal to noise ratio for data recovery.

In one aspect the present invention provides a return-to-zero (RZ) recovery system. The return-to-zero recovery system in one embodiment comprises a filter configured to receive a data signal and to reduce high frequency components from the data signal to form a filtered data signal and a recovery unit configured to receive the filtered data signal identify a first type of data transition and provide phase information when the first type of data transition is identified.

In a further aspect the present invention provides a method of sampling return-to-zero data. In one embodiment the method comprises receiving a data signal; identifying a transition to a second data state from a first data state; and providing phase information when the transition is identified.

In a further aspect the present invention provides a method of sampling return-to-zero data. In one embodiment the method comprises determining first phase information from a data signal when a first type of data transition occurs; determining second phase information from a data signal when a second type of data transition occurs; generating a first clock signal based on the first phase information; generating a second clock signal based on the second phase information; generating a third clock signal based on the first and second clock signals.

In a further aspect the present invention provides a return-to-zero (RZ) recovery system. In one embodiment the system comprises first recovery unit configured to receive a data signal and identifying a first type of data transition and determining a first phase information when the first type of data transition is identified; and second recovery unit configured to receive the data signal and identifying a second type of data transition and determining second phase information when the second type of data transition is identified.

These and other aspects of the present invention will be more readily understood upon review of the accompanying drawings and following detailed description.

DETAILED DESCRIPTION

Figure 1:
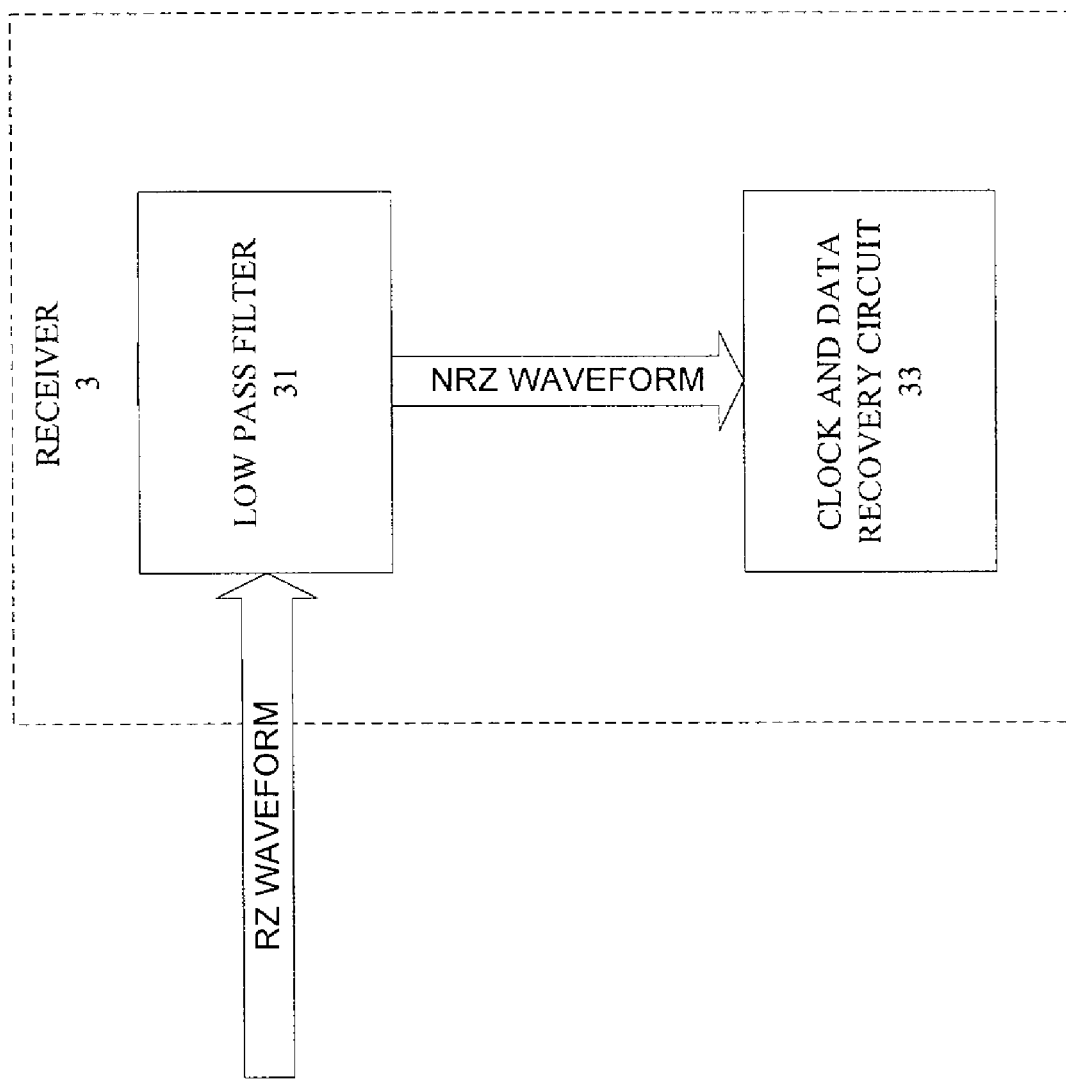
FIG. 1 is a block diagram of an embodiment of a receiving unit with a clock and data recovery unit.

In FIG. 1, a return to zero (RZ) optical pulse waveform is supplied as an input to a receiver 3. The receiver 3 includes a low-pass filter 31 and a non-return to zero (NRZ) clock and a clock and data recovery unit 33. The RZ optical pulse waveform is provided to the low pass filter. The low pass filter removes or attenuates the high frequency components in the RZ waveform. As such, the RZ waveform is largely transformed into a NRZ signal. The NRZ signal is supplied to the clock and data recovery (CDR) unit. The CDR unit extracts the clock signal encoded in the NRZ signal. Hence, a local clock at the receiver is synchronized to the extracted clock signal.

The low-pass filter, by removing or attenuating high frequency components contained in the received RZ waveform performs two functions. The first function is a validation function that detects or qualifies that a one or high level is valid when a specific voltage level is maintained for a specific amount of time. In other words, transient high voltages are filtered out, and do not result in false data readings or otherwise impact system operation. In addition the slope of the rising and falling edges of waveform are somewhat flattened, potentially increasing the size of the data eye. The second function is a phase function that maintains or adjusts the RZ waveform to have a one to zero transition time at approximately the same position with respect to the bit time as a zero to one data transition. A potential problem with the low-pass filter performing both functions, however, is that sharp transitions in the data-eye are blurred, with negative effects on data-eye shape.

In one embodiment, the CDR unit performs the phase function. Thus, the cut-off frequency of the low-pass filter may be increased, allowing increased frequency components of the signal to improve the shape of the data-eye. The low-pass filter can therefore be optimized to achieve optimal results for the validation function without having to provide a trade off to achieve optimal results to perform the phase function.

In one embodiment, the CDR unit receives RZ waveform as an input. The RZ waveform has zero to one data signal transitions spaced nominally at the start of the bit period. However, one to zero data signal transitions occur at normally less than half the bit period after the zero to one data signal transition. The CDR unit rejects phase information, or alternatively does not perform comparisons to obtain phase information, except at zero to one data signal transitions. As such, the phase detector operates only when data bits prior to and following a perceived zero to one data transition occurs.

Figure 2:
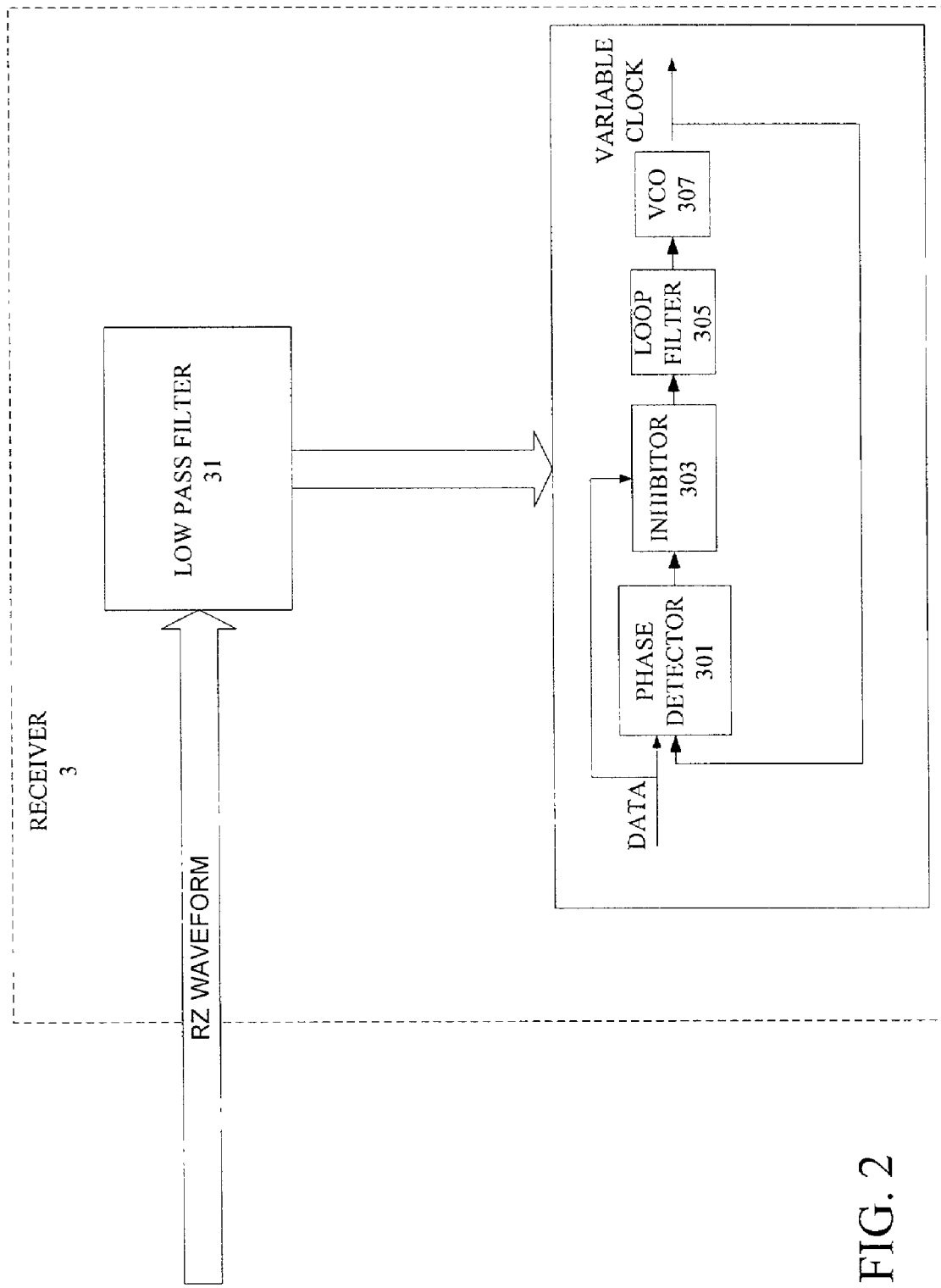
FIG. 2 is a block diagram of an embodiment of a clock and data recovery unit.

FIG. 2 illustrates a block diagram of an embodiment of a CDR unit in accordance with the present invention. In FIG. 2, the CDR unit includes a phase detector 301, an inhibitor 303, a loop filter 305 and a voltage controlled oscillator (VCO) 307. The CDR unit receives a data signal and a reference clock signal, and generates an output clock signal. The phase detector detects the amount by which the phase of the recovered clock signal leads or lags the phase of the transmitted data signal. The phase detector receives the data signal and the output clock signal and generates a phase difference signal. In various embodiments the phase difference signal is based on up/down signals, increment/decrement signals, or other signals, depending on specific PLL, or DPLL implementations. The phase difference signal is proportional to the difference in phase between the transmitted data signal and the output clock signal. The phase difference signal is provided to the inhibitor.

The inhibitor receives the data signal and determines if a zero to one data transition has occurred. If a zero to one data transition has occurred, the inhibitor provides the phase difference signal to the loop filter. Otherwise, the inhibitor does not provide the phase difference signal to the loop filter. In one embodiment, this is accomplished using shift registers and simple logic, although in other embodiments various circuitry is utilized. In one embodiment, circuitry for performing the inhibitor function is contained within the phase detector block.

The loop filter filters the phase difference signal and provides the filtered phase difference signal to the VCO as a control voltage signal. The VCO generates the output clock signal based on the filtered phase difference signal. The VCO adjusts the oscillation frequency of the output clock signal based on the filtered phase difference signal.

If the phase of the reference clock signal leads the phase of the shifted output clock signal, the filtered phase difference signal indicates a need for a phase shift, i.e., for the shifted variable clock signal to speed up. On the other hand, if the phase of the reference clock signal lags behind the phase of the shifted variable clock signal, the filtered phase difference signal indicates a need for a phase shift, i.e., for the shifted variable clock signal to slow down.

In another embodiment, the inhibitor is placed before the phase detector instead of after the phase detector. The inhibitor receives the data signal and determines if a zero to one data transition occurs. If a zero to one data transition occurs, the inhibitor provides the data signal to the phase detector. Otherwise, the inhibitor does not provide the data signal to the phase detector. Subsequently, the phase detector provides a phase difference signal to the loop filter. In various embodiments, the CDR unit is composed of analog components and/or digital components.

Figure 3:
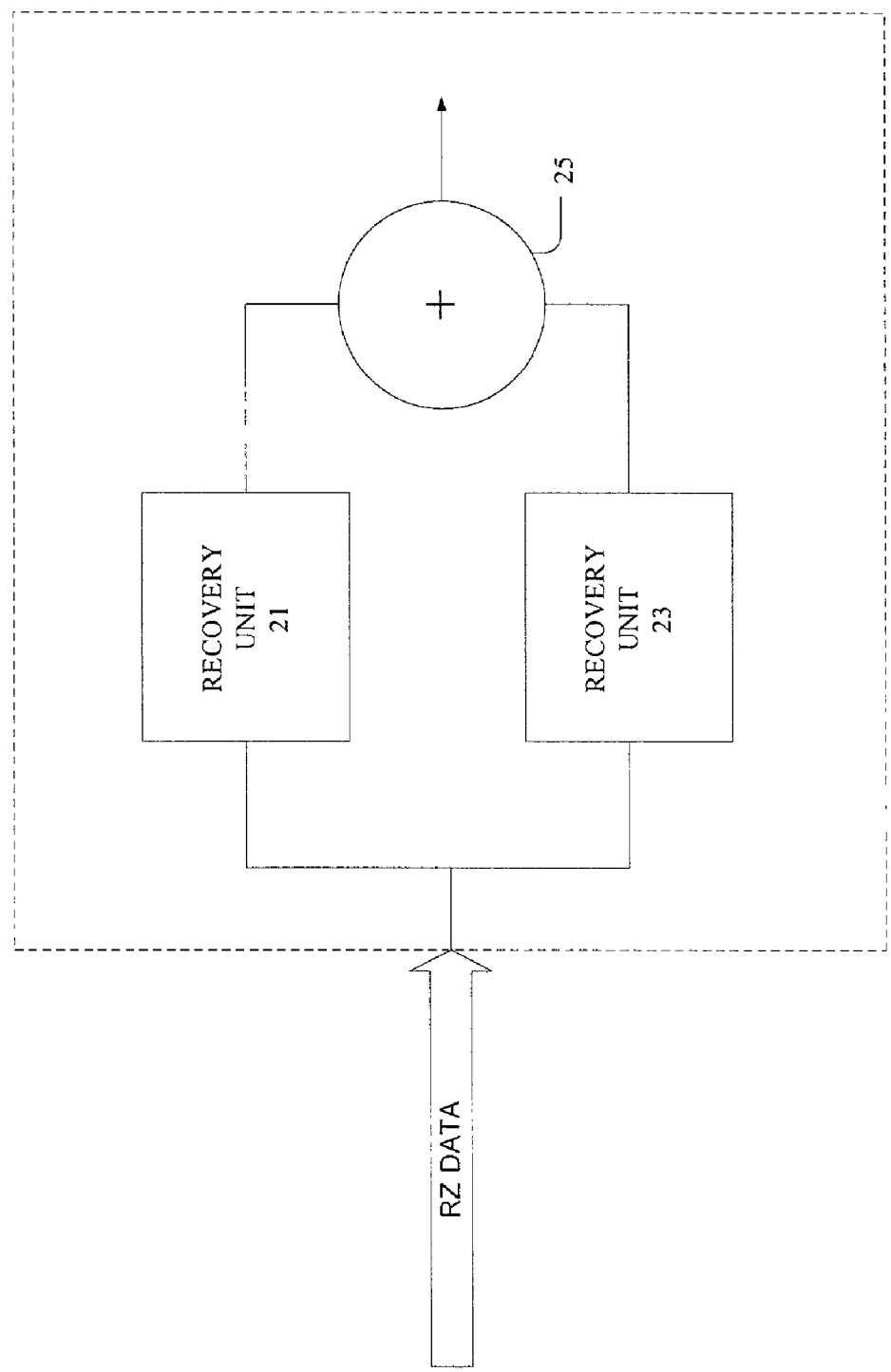
FIG. 3 is a block diagram of a multiple recovery unit clock signal provider adapted for use with RZ data systems.

In FIG. 3, a data signal, e.g., an RZ data signal, is supplied to a first recovery unit 21 and a second recovery unit 23. The first recovery unit extracts a first clock signal from the data signal. Similarly, the second recovery unit extracts a second clock signal from the data signal. The first and second clock signals are provided to an adder or interpolator 25. The interpolator provides an output clock signal based on the first and second clock signals.

In one embodiment, the first recovery unit receives an RZ data signal and recovers a clock signal from the RZ data signal based on rising edge signal transitions. Thus, in some embodiments the first recovery unit rejects phase information, or alternatively does not perform comparisons to obtain phase information, except at zero to one data transitions. As such, for example, a phase detector of the first recovery unit provides for phase adjustment around a perceived zero to one data transition. The first clock signal is therefore adjusted to be in phase with the zero to one transitions in the RZ data signal.

The second recovery unit also receives the RZ data signal and recovers a clock signal from the RZ data based on falling edge signal transitions. Thus, in some embodiments the second recovery unit rejects phase information, or alternatively does not perform comparisons to obtain phase information, except at one to zero data transitions. As such, for example, a phase detector of the second recovery unit provides for phase adjustment when data bits around a perceived one to zero data transition. The second clock signal is therefore adjusted to be in phase with the one to zero transitions in the RZ data signal.

The interpolator adds the first clock signal and the second clock signal to form an output clock signal. The first clock signal and the second clock signal have rising edges bounding an expected data eye of the RZ data signal. The output clock signal, formed by combining the first clock signal and the second clock signal, has a rising edge, or is in phase with, the expected data eye of the RZ data signal. In some embodiments the combining of the first clock signal and the second clock signal is performed using weighted summers, which also allows for some further phase shift in the output clock signal to more accurately sample in the middle of the data eye.

Figure 4:
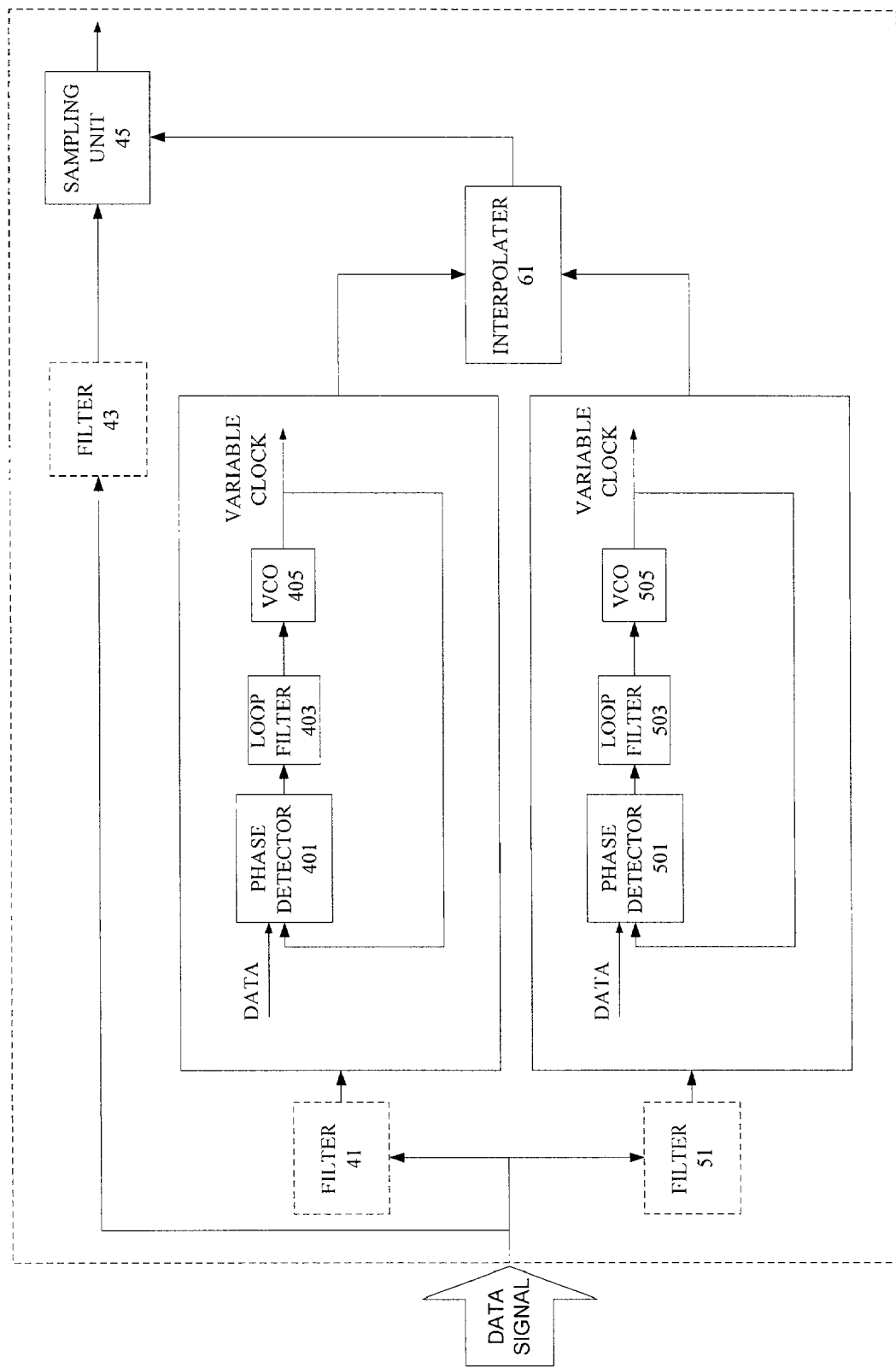
FIG. 4 is a block diagram of a receiver with multiple CRU instantiations.

FIG. 4 illustrates a block diagram of an embodiment of a receiver in accordance with the present invention. In FIG. 4, the receiver receives a data signal. In one embodiment, the data signal is an RZ data signal. The data signal is supplied to two clock recovery units. A first clock recovery unit includes a phase detector 401, a loop filter 403 and a voltage controlled oscillator (VCO) 405. A second clock recovery unit includes a phase detector 501, a loop filter 503 and a VCO 505.

The recovery units generate clock signals that are supplied to an interpolator 61. The interpolator, in one embodiment, compares or adds the clock signals together to generate an output clock signal. The output clock signal is supplied to a sampling unit or an output buffer 45. The output buffer generates a data signal based on the output clock signal and the incoming data signal.

The phase detector 401 receives the data signal and the clock signal generated by the VCO 405. The phase detector 401 determines if a zero to one data transition has occurred. If a zero to one data transition has occurred, the phase detector determines whether the rising edge of the clock signal is early or late with respect to the data transition and generates a phase difference signal. In one embodiment, if the rising edge of the clock signal is early, a slow, or down, signal is generated. If the rising edge of the clock signal is late a fast, or up, signal is generated. The up/down signals are provided to the loop filter 403. Thus, the phase detector 401 may be viewed in one embodiment as a rising edge phase detector.

In an alternative embodiment, the phase detector determines a phase difference between the data signal and the clock signal. In other words, the phase detector determines the amount by which the phase of the clock signal leads or lags the phase of the data signal, about zero to one transitions in the data signal. The phase detector generates a phase difference signal that, in one embodiment, is proportional to the difference in phase between the data signal and the recovered clock signal. In the alternative embodiment, the phase difference signal is provided to the loop filter.

Returning to FIG. 4, the loop filter filters the up/down signals and provides a filtered up/down signal to the VCO 405. The VCO generates the clock signal based on the up/down signal. As such, the VCO adjusts the oscillation frequency of the output clock signal based on the filtered up/down signal. The clock signal is supplied to the interpolator 61.

The phase detector 501 receives the data signal and the clock signal generated by the VCO 505. The phase detector 501 determines if a one to zero data transition has occurred. If a one to zero data transition has occurred, the phase detector determines whether the rising edge of the clock signal is early or late with respect to the data transition and generates a phase difference signal. In one embodiment, if the rising edge of the clock signal is early, a slow, or down, signal is generated. If the rising edge of the clock signal is late a fast, or up, signal is generated. The up/down signals are provided to the loop filter 503. Thus, the phase detector 501 may be viewed in one embodiment as a falling edge phase detector.

In an alternative embodiment, the phase detector determines a phase difference between the data signal and the clock signal. In other words, the phase detector determines the amount by which the phase of the clock signal leads or lags the phase of the data signal, about zero to one transitions in the data signal. The phase detector generates a phase difference signal that, in one embodiment, is proportional to the difference in phase between the data signal and the recovered clock signal. In the alternative embodiment, the phase difference signal is provided to the loop filter.

Referring back to FIG. 4, the loop filter filters the up/down signals and provides the filtered up/down signal to the VCO 505. The VCO generates the clock signal based on the filtered up/down signal. As such, the VCO adjusts the oscillation frequency of the output clock signal based on the filtered up/down signal. The clock signal is supplied to the interpolator 61.

In one embodiment, a plurality of phase-shifted clock signals are provided by a single VCO. The frequency of the VCO, for example, is controlled or determined by the rising edge phase detector. The falling edge phase detector outputs are used in forming a selection signal used to select one of the clock signals provided by the VCO.

The interpolator additively mixes the clock signals from the VCOs to form an output clock signal. The output clock signal is provided to the sampling unit. The sampling unit recovers data from the data signal, and, for example, forms an NRZ data signal.

In one embodiment, a filter 43 filters the RZ data signal provided to the sampling unit. The filter filters out the high frequency components of the data signal, and thereby stretches out the data eye of the data signal. Thus, the sampling area of the data eye available to recover the data becomes larger and thereby sampling is easier to perform. In such a variation, the filter 43 also filters, in one embodiment, the RZ data signal provided to the rising edge phase detector and the falling edge phase detector to allow for phase shifts in the data eye due to the filter. In a further embodiment filters 41 and 51 are also available to filter the data signals provided to the clock recovery units. In operation the use of such filters may allow for optimal stretching of the RZ signal to form an NRZ type signal used by the clock recovery units for clock recovery.

Accordingly, the present invention provides for RZ recovery. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive.

The invention claimed is:

1. A return-to-zero (RZ) recovery system comprising:
   first recovery unit configured to receive a data signal and identify a first type of data transition and determine a first phase information when the first type of data transition is identified;
   second recovery unit configured to receive the data signal and identify a second type of data transition and determine second phase information when the second type of data transition is identified; and
   wherein the first recovery unit generates a first recovered clock signal based on the determined first phase information and the second recovery unit generates a second recovered clock signal based on the determined second phase information; and
   further comprising an interpolator configured to generate a third recovered clock signal based on the first recovered clock signal and the second recovered clock signal; and
   wherein the data signal is a RZ data signal and the system further comprises a sampling unit and a filter, the filter configured to convert the RZ data signal into a non-return-to-zero (NRZ) data signal and provide the NRZ data signal to the sampling unit.

2. The system of claim 1 wherein the sampling unit samples the data signal using the third recovered clock signal from the interpolator.

3. A return-to-zero (RZ) recovery system comprising:
   first recovery unit configured to receive a data signal and identify a first type of data transition and determine a first phase information when the first type of data transition is identified; and
   second recovery unit configured to receive the data signal and identify a second type of data transition and determine second phase information when the second type of data transition is identified; and
   wherein the first recovery unit generates a first recovered clock signal based on the determined first phase information and the second recovery unit generates a second recovered clock signal based on the determined second phase information; and wherein the data signal is a RZ data signal and the system further comprises a sampling unit and a filter, the filter configured to convert the RZ data signal into a non-return-to-zero (NRZ) data signal and provide the NRZ data signal to the first recovery unit.

4. The system of claim 3 wherein the second recovery unit is disabled.

* * * * *